United States Patent [19]
Jinbo

[11] Patent Number: 5,907,506
[45] Date of Patent: May 25, 1999

[54] ERASING METHOD AND ERASING DEVICE FOR NON-VOLATILE SEMICONDUCTOR MEMORY

[75] Inventor: Toshikatsu Jinbo, Tokyo, Japan

[73] Assignee: NEC Corporation, Tokyo, Japan

[21] Appl. No.: 09/008,865

[22] Filed: Jan. 20, 1998

[30] Foreign Application Priority Data

Jan. 30, 1997 [JP] Japan ................................. 9-016811

[51] Int. Cl.$^6$ ............................................... G11C 16/04
[52] U.S. Cl. ............................. 365/185.29; 365/185.18; 365/185.27
[58] Field of Search ............................. 365/185.29, 218, 365/185.18, 185.25, 185.27

[56] References Cited

U.S. PATENT DOCUMENTS

| | | | |
|---|---|---|---|
| 5,077,691 | 12/1991 | Haddad et al. | 365/218 |
| 5,534,455 | 7/1996 | Liu | 437/43 |
| 5,608,671 | 3/1997 | Ninomiya | 365/185.29 |
| 5,721,707 | 2/1998 | Villa et al. | 365/218 |
| 5,770,963 | 6/1998 | Akaogi et al. | 365/185.29 |

FOREIGN PATENT DOCUMENTS

| | | |
|---|---|---|
| 6-151785 | 5/1994 | Japan . |
| 6-275842 | 9/1994 | Japan . |

OTHER PUBLICATIONS

Toshikatsu Jinbo et al., IEEE Journal of Solid State Circuits, vol. 27, No. 11, A 5–V–Only 16–Mb Flash Memory with Sector Erase Mode, Nov. 1992, pp. 1547–1554.

Albert Bergemont et al., IEEE Transactions on Electron Devices, vol. 43, No. 9, Low Voltage NVG™: A New High Performance 3 V/5 V Flash Technology for Portable Computing and Telecommunications Applications, Sep. 1992, pp. 1510–1517.

Primary Examiner—Son Mai
Attorney, Agent, or Firm—Young & Thompson

[57] ABSTRACT

In non-volatile semiconductor memory erasing method and device, in an erasing operation, a negative potential is applied to the gate of each memory cell (MC00 to MCmn), a positive potential which is equal or above a supply voltage Vcc from the external is applied to the channel of each memory cell, and the source and drain of each memory cell are connected to the ground potential through a high-resistant current path by a cell voltage control circuit, thereby obtaining a stable erasing characteristic in the erasing operation.

28 Claims, 14 Drawing Sheets

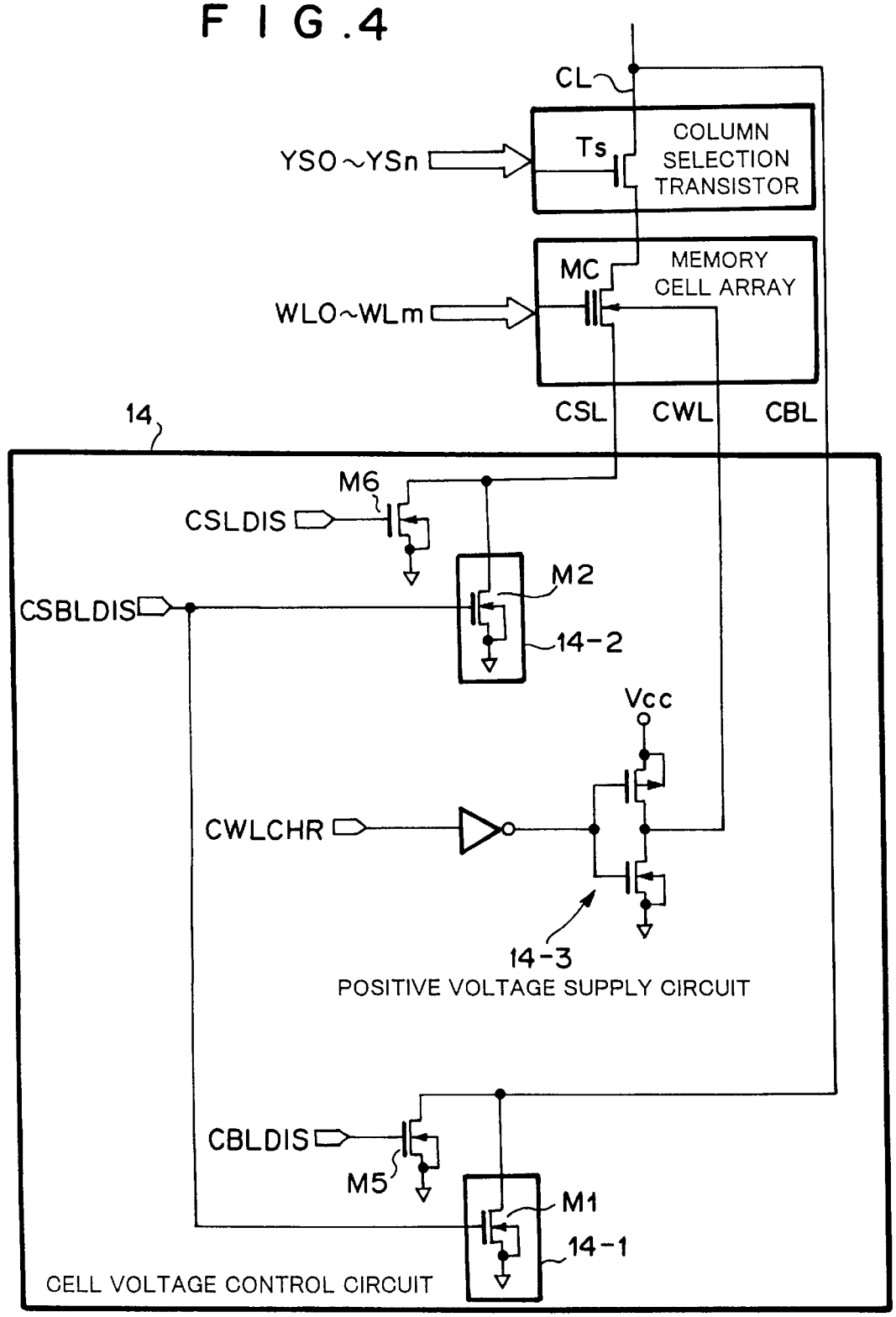

ERASING METHOD AND ERASING DEVICE FOR NON-VOLATILE SEMICONDUCTOR MEMORY

BACKGROUND OF THE INVENTION

1. Field of the Invention

The present invention relates to an erasing method and an erasing device for a non-volatile semiconductor memory on the basis of a channel erasing system.

2. Description of the Prior Art

A gate/source erasing system and a channel erasing system are known erasing systems for a non-volatile semiconductor memory. The gate/source erasing system is disclosed in, for example, U.S. Pat. No. 5,077,691,. Briefly, according to the gate/source erasing system, an erasing operation is performed by applying a negative voltage to the gate of a memory cell while applying a positive voltage to the source of the memory cell and keeping the drain of the memory cell opened at the erasing time.

FIG. 13 shows the structure of a memory cell which is suitable for the gate/source erasing system. As shown in FIG. 13, drain D is formed on a P-type substrate P-sub on the basis of an $N^+$-diffusion layer, and source S is formed on the P-type substrate on the basis of an $N^-$ diffusion layer and an $N^+$ diffusion layer. Floating gate FG and control gate CG are formed on this substrate. In the gate/source erasing type memory cell as mentioned above, an interband tunnel current flows from the source S to the substrate P-sub, and thus the current consumption is large. Further, a high withstanding voltage structure is indispensable to the source S, so that a special manufacturing step of forming the junction of the source diffusion layer deeply is necessary, and a restriction is imposed on minimum gate size.

The channel erasing system can solve the aforementioned problem of the gate/source erasing system, and FIG. 14 shows the structure of the memory cell which is suitable for the channel erasing system. In this memory, drain D based on an $N^+$ diffusion layer and source S based on a $N^+$ diffusion layer are formed on a P-type substrate P-sub. On the substrate are formed floating gate FG and control gate CG. In such a channel erasing type memory cell, no high electric field is applied to the source S, and thus the source S may be designed in the same structure as the drain D. Further, when the effective channel length Leff is set to the same as shown in FIG. 13, the dimension of each gate can be reduced, and thus this is effective to reduce the size of the memory cell.

Next, the channel erasing system will be briefly explained with reference to FIGS. 15 and 16.

FIG. 15 shows a system (hereinafter referred to as "first system") in which the drain and source of the memory cell are kept open and a negative voltage of –13 (V) is applied to the gate of the memory cell while a positive voltage of 5(V) is applied to the substrate portion. Such a system is disclosed in "A 5-V-Only 16-Mb Flash Memory with Sector Erase Mode" of IEEE JOURNAL OF SOLID-STATE CIRCUITS, pp1547–1554 VOL. 27. NO. 11 NOVEMBER 1992.

FIG. 16 shows a system (hereinafter referred to as "second system") in which a positive voltage of 3(V) is applied to the drain and source of the memory cell, a negative voltage of –15(V) is applied to the gate of the memory cell and a positive voltage of 3(V) is applied to the substrate portion. Such a system is disclosed in "Low Voltage NVGTM: A New High Performance 3V/5V Flash Technology for Portable Computing and Telecommunications Applications" of IEEE TRANSACTION ON ELECTRON DEVICES, pp1510–1517, VOL. 43. NO.9 SEPTEMBER 1996.

In the first system, the problem of the gate/source erasing system is avoided, however, it has an unstable erasing characteristic because the source/drain of the memory cell is kept open and thus the source/drain may be set to a higher voltage than the substrate of the memory cell due to the fluctuation of a power source or the like.

On the other hand, in the second system, the problems of the gate/source erasing system and the first system are avoided. However, circuits for applying a voltage to the source and drain of the memory cell respectively are needed, and particularly the circuit for applying the voltage to the drain has a large overhead.

SUMMARY OF THE INVENTION

An object of the present invention is to provide an erasing method for a non-volatile semiconductor memory which can obtain a stable erasing characteristic in an erasing operation by adding a circuit for stabilizing the potential of the source and drain of a memory cell.

Another object of the present invention is to provide an erasing device for a non-volatile semiconductor memory which is suitable for the erasing method.

A first non-volatile semiconductor memory erasing method based on a channel erasing system according to the present invention is characterized by comprising the steps of applying a negative potential to the gate of a memory cell, applying to the channel of the memory cell a positive potential which is above a supply voltage Vcc from the external, and connecting the source and drain of the memory cell to the ground potential through a current path having a high resistance.

According to the first erasing method of the present invention, the current path is a circuit containing a switching element and a high resistant element or a constant current element.

In the first erasing method of the present invention, the application of the positive potential to the channel is performed by applying a positive potential to the well or substrate portion of the memory cell.

In the first erasing method of the present invention, there is provided means for simultaneously discharging the potential of the substrate portion of the memory cell and the potential of the source and drain of the memory cell when the erasing operation is finished.

A second non-volatile semiconductor memory erasing method of erasing a memory cell containing a floating gate and a control gate on the basis of a channel erasing system is characterized by comprising the steps of setting the first capacitance between the floating gate and the control gate to be higher than the second capacitance between the floating gate and the channel, and applying a negative potential to the gate of the memory cell while applying a positive potential of a supply voltage Vcc from the external in an erasing operation.

In the second erasing method of the present invention, the film thickness between the floating gate and the control gate may be set to a small value while the film thickness between the floating gate and the channel is set to a large value, thereby setting the first capacitance to be higher than the second capacitance.

In the second erasing method, an insulating film between the floating gate and the control gate may be formed of a nitride film, a multilayered film of an oxide film and a nitride film, or a high dielectric-constant film such as tantalum oxide or the like, thereby setting the first capacitance to be higher than the second capacitance.

In the second erasing method of the present invention, the source and drain of the memory cell may be connected to the ground potential through a current path having high resistance in the erasing operation as in the case of the first erasing method.

In the second erasing method of the present invention, the current path is constructed by a circuit containing a switching element and a high-resistant element or a constant current element, and the application of the positive potential to the channel is performed by applying a positive potential to the well or substrate portion of the memory cell.

In the second erasing method of the present invention, there is provided means for simultaneously discharging the potential of the substrate portion of the memory cell and the potential of the source and drain of the memory cell when the erasing operation is finished.

A first erasing device for erasing a non-volatile semiconductor memory on the basis of a channel erasing system is characterized by comprising a voltage supply circuit for applying a negative potential to the gate of a memory cell in an erasing operation, and a control circuit for applying to the channel of the memory cell a positive potential which is above a supply voltage Vcc from the external, and connecting the source and drain of the memory cell to the ground potential through a current path having high resistance.

In the first erasing device of the present invention, the drains of the respective memory cells are commonly connected to a column selection transistor every column, each column selection transistor is connected to a common drain line, the well or substrate portion of the memory cell is connected to a common substrate line while the source of the memory cell is connected to a common source line, and the control circuit includes a first current path containing a first switching element which is connected to the common drain line and performs an on/off operation on the basis of an erasing control signal, and a high resistant element or constant current element, a second current path containing a second switching element which is connected to the common source line and performs an on/off operation on the basis of the erasing control signal, and a high resistant element or a constant current element, and a circuit which is connected to the common substrate line and applies a positive potential to the well or substrate portion of the memory cell on the basis of the erasing control signal.

In the first erasing device of the present invention, it may be constructed that the drains of the respective memory cells are commonly connected to a column selection transistor every column, each column selection transistor is connected to a common drain line, the well or substrate portion of the memory cell is connected to a common substrate line while the source of the memory cell is connected to a common source line, and the control circuit includes a first current path containing a first switching element which is connected to the common drain line and performs an on/off operation on the basis of an erasing control signal, and a high resistant element or constant current element, a third switching element which is connected across the common source line and the common drain line and conducts the common source line and the common drain line to each other on the basis of the erasing control signal, and a circuit which is connected to the common substrate line and applies a positive potential to the well or substrate portion of the memory cell on the basis of the erasing control signal.

In the first erasing device of the present invention, the control circuit may further include a fourth switching element which is connected across the common substrate line and the first current path to conduct the common substrate line and the first current path when the erasing operation is finished, thereby simultaneously discharging the potential of the substrate portion of the memory cell and the potential of the source, drain of the memory cell.

A second non-volatile semiconductor memory erasing device for erasing a memory cell containing a floating gate and a control gate on the basis of the a channel erasing system, is characterized by including a voltage supply circuit for applying a negative potential to the gate of the memory cell and a control circuit for applying a positive potential of a supply voltage Vcc from the external to the channel of the memory cell when the erasing operation is performed and in that the first capacitance between the floating gate and the control gate is set to be higher than the second capacitance between the floating gate and the channel.

In the second erasing device of the present invention, the film thickness between the floating gate and the control gate is set to be small, and the film thickness between the floating gate and the channel is set to be large, whereby the first capacitance is set to be higher than the second capacitance.

The insulating film between the floating gate and the control gate is formed of a nitride film or a multilayered film of an oxide film and a nitride film or a high dielectric constant film such as tantalum oxide or the like, whereby the first capacitance is set to be higher than the second capacitance.

In the second erasing device of the present invention, the control circuit may connect the source, drain of the memory cell to the ground potential through a current path having high resistance when the erasing operation is performed.

According to the second erasing device of the present invention, as in the case of the erasing device according to the third aspect of the present invention, the drain of each memory cell is commonly connected to a column selection transistor every column, each column selection transistor is connected to a common drain line, the well or substrate portion of the memory cell is connected to a common substrate line while the source of the memory cell is connected to a common source line, and the control circuit includes a first current path containing a first switching element which is connected to the common drain line and performs an on/off operation in accordance with the erasing control signal, and a high-resistant element or constant current element, a second current path containing a second switching element which is connected to the common source line and performs an on/off operation on the basis of the erasing control signal, and a high-resistant element or constant current element, and a circuit which is connected to the common substrate line and applies a positive potential to the well or substrate portion of the memory cell in accordance with the erasing control signal.

In the second erasing device of the present invention, the drain of each memory cell is commonly connected to a column selection transistor every column, each column selection transistor is connected to a common drain line, the well or substrate portion of the memory cell is connected to a common substrate line while the source of the memory cell is connected to a common source line, and the control circuit includes a first switching element which is connected to the common drain line and performs an on/off operation on the basis of an erasing control signal, and a high-resistant element or constant current element, a third switching element which is connected across the common source line and the common drain line to conduct the common source line and the common drain line to each other in accordance with the erasing control signal, and a circuit which is connected to the common substrate line to apply a positive potential to the well or substrate portion of the memory cell in accordance with the erasing control signal.

In the second erasing device of the present invention, the control circuit may include a fourth switching element which is connected across the common substrate line and the first current path to conduct the common substrate line and the first current path to each other when the erasing operation is finished, thereby simultaneously discharging the potential of the substrate portion of the memory cell and the potential of the source, drain of the memory cell.

In all of the erasing methods and the erasing devices explained above, the ground potential may be supplied from the external. Further, the negative potential may be applied to the gate after the positive potential is applied to the channel of the memory cell.

BRIEF DESCRIPTION OF THE DRAWINGS

FIG. 4 is a diagram showing a first embodiment of the cell voltage control circuit shown in FIG. 1;

DETAILED DESCRIPTION OF THE PREFERRED EMBODIMENTS

Preferred embodiments according to the present invention will be described hereunder with reference to the accompanying drawings.

Figure 1:
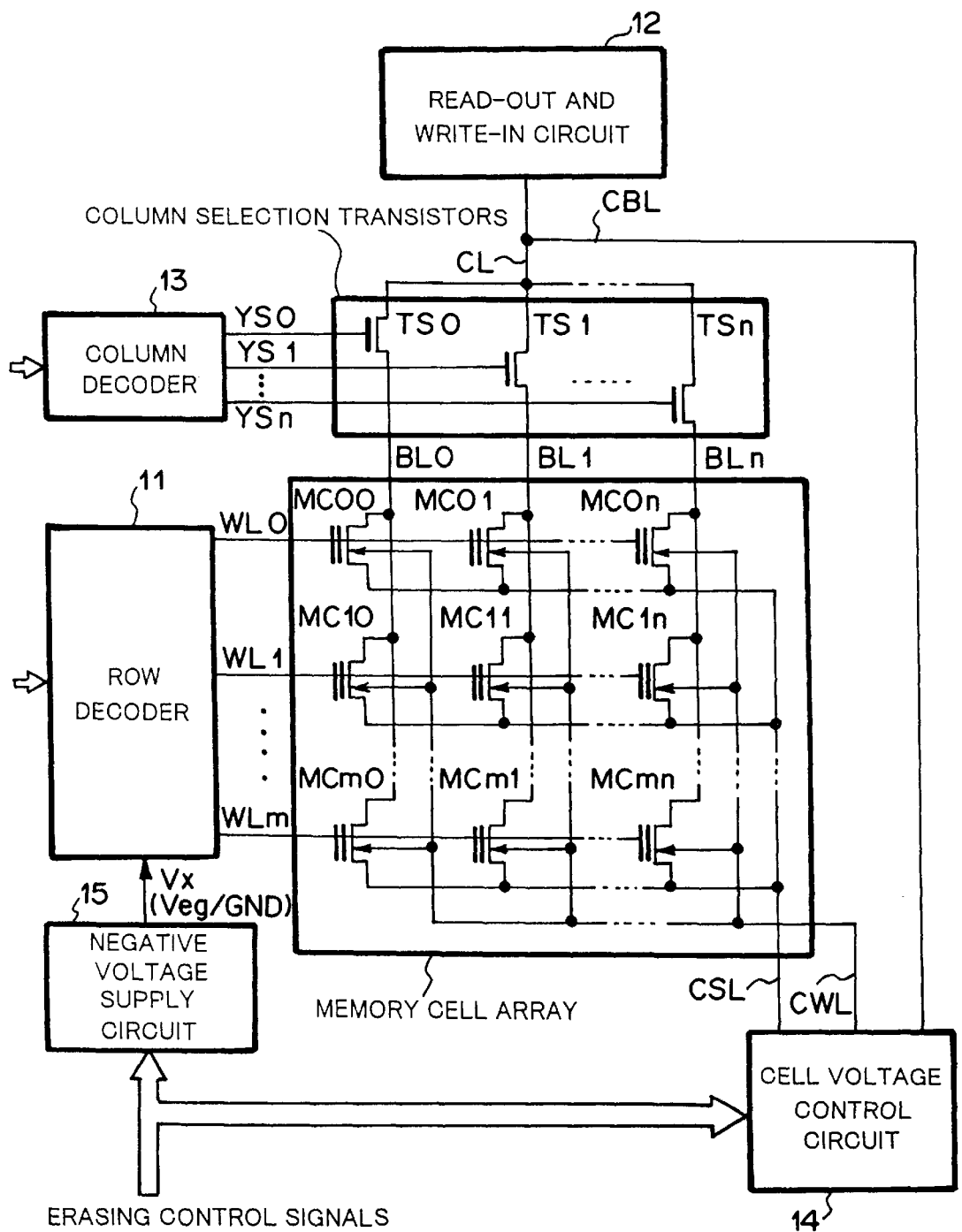
FIG. 1 is a diagram showing the preferable modes of the present invention.

FIG. 1 is a diagram showing the structure for implementing an erasing method based on the channel erasing system according to the present invention, and shows a part of a semiconductor memory and appendant portions thereto and an erasing device. The semiconductor memory includes memory cells MC00 to MCmn which are connected to the intersection points between row lines WL0, WL1, . . . , WLm and column lines BL0, BL1, . . . , BLn. Row lines WL0 to WLm are connected to row decoder 11, and column lines BL0 to BLn are commonly connected to one another (common connection line CL) through column selection transistors TS0, TS1, . . . , TSn respectively. Common connection line CL is connected to read-out and write-in circuit 12. The gates of column selection transistors TS0 to TSn are connected to column decoder 13 through column selection lines YS0, YS1, . . . , Ysn. The above elements correspond to the semiconductor memory and the portion appendant thereto, and the present invention is characterized in that the following elements are added to the above elements.

The drains of memory cells MC00 to MCmn are commonly connected to the sources of column selection transistors TS0 to TSn every column, and cell voltage control circuit 14 is connected through common drain line CBL to the common connection line CL which is connected to the drains of column selection transistors TS0 to TSn. The substrate portions of memory cells MC00 to MCmn are connected to cell voltage control circuit 14 through common substrate line CWL, and the sources of memory cells NMC00 to MCmn are connected to cell voltage control circuit 14 through common source line CSL. Erasing control signals are supplied from a control circuit (not shown) to cell voltage control circuit 14. Common substrate line CWL may be connected to the well portion of memory cells MC00 to MCmn, and in the following description it is assumed that it is connected to the substrate portion.

Row decoder 11 is connected to negative voltage supply circuit 15, and the erasing control signals are supplied to negative voltage supply circuit 15. Negative voltage supply circuit 15 is used to supply a negative voltage to the gates of memory cells MC00 to MCmn through row decoder 11 and row lines WL0 to WLm.

Figure 2:
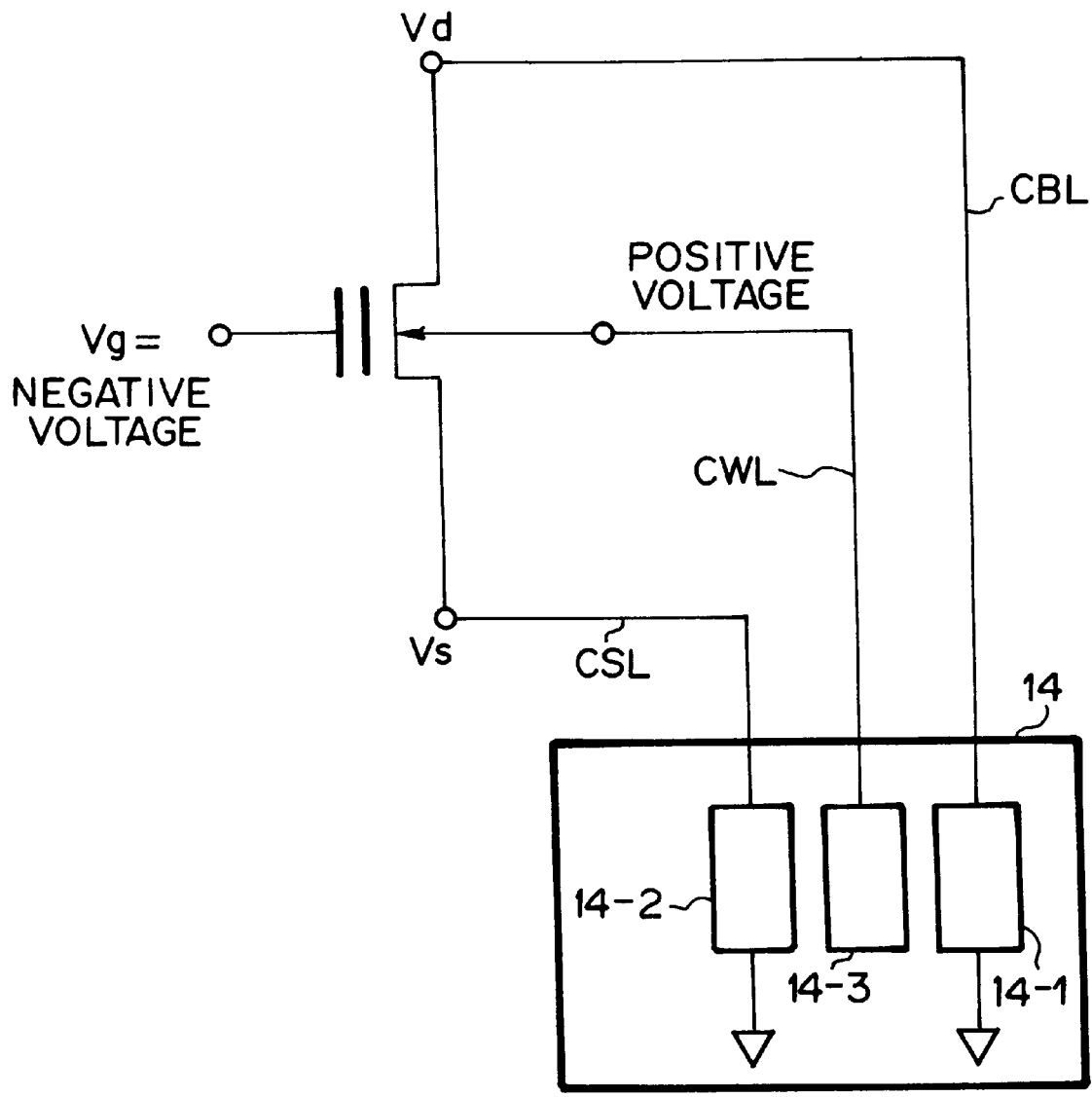
FIG. 2 is a diagram showing the construction of a cell voltage control circuit shown in FIG. 1.

FIG. 2 is a diagram showing the principle of the operation of the erasing method according to the present invention and shows one memory cell. Cell voltage control circuit 14 includes first current path 14-1 connected to common drain line CBL and having a first switching element (transistor) which performs an on/off operation on the basis of the erasing control signal and a high-resistant element or a constant current element, a second current path 14-2 connected to common source line CSL and having a second switching element (transistor) which performs an on/off operation on the basis of the erasing control signal and a high-resistant element or a constant current element, and a positive voltage supply circuit 14-3 which is connected to common substrate line CWL and applies a positive potential to the substrate portion of each memory cell in accordance with the erasing control signal.

Briefly, it is the feature of the present invention that the positive voltage is applied from the positive voltage supply circuit 14-3 to the substrate portion of each memory cell, that the negative voltage is applied to the gate of each memory cell, and that the drain and the source of each memory cell are connected to the ground potential through the first and second current paths 14-1 and 14-2, respectively at the erasing time. The ground potential may be supplied from the internal or the external.

Figure 3A:
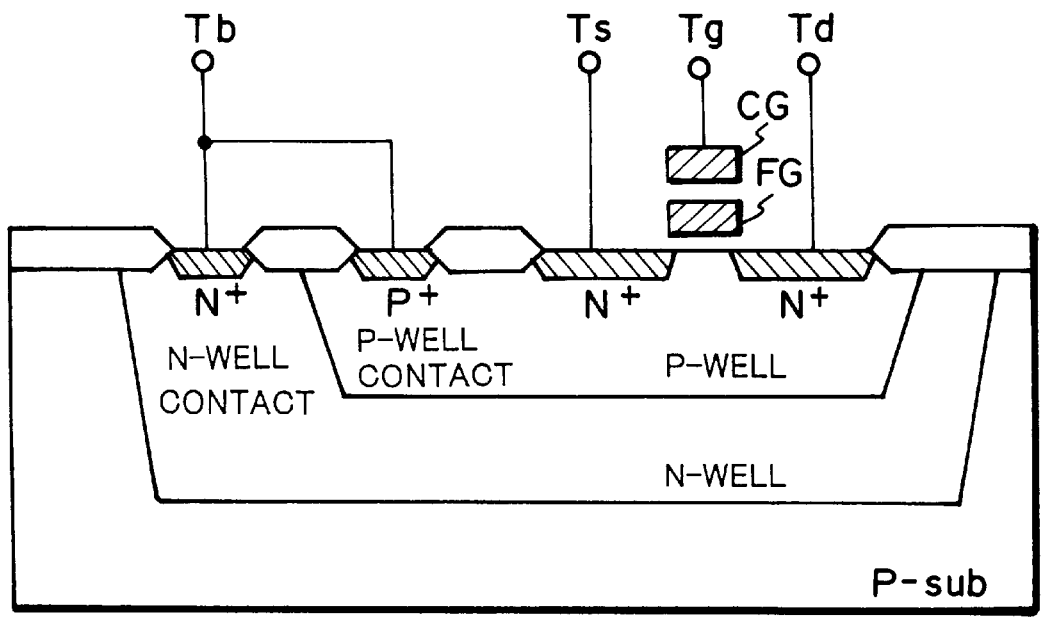
FIG. 3A is a cross-sectional view showing the structure of a memory cell on a P-type substrate to which the present invention is applied.
Figure 3B:
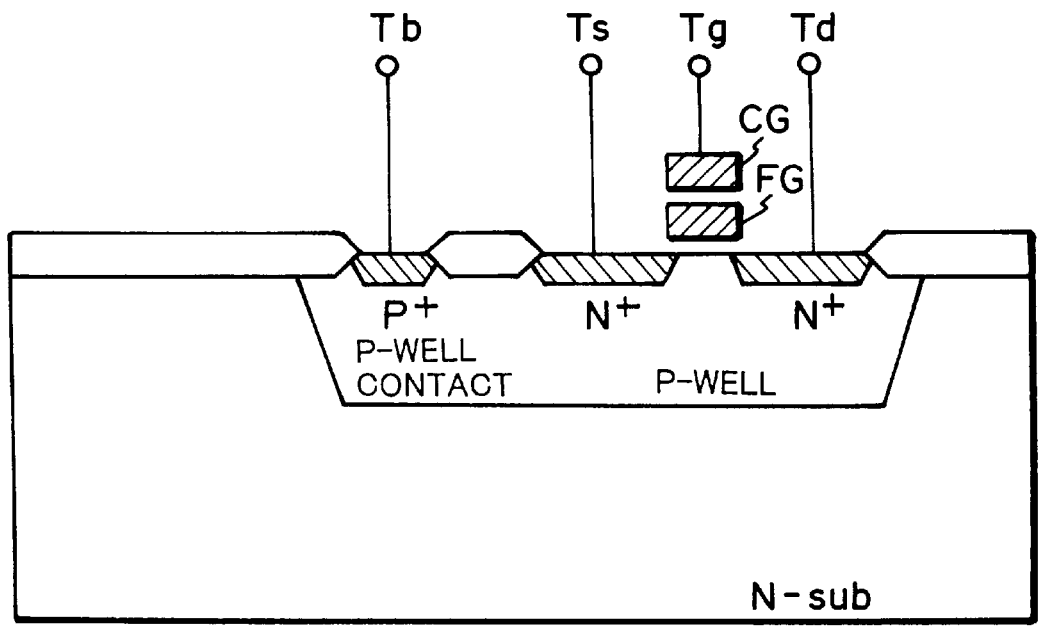
FIG. 3B is a cross-sectional view showing the structure of a memory cell on an N-type substrate to which the present invention is applied.

FIGS. 3A and 3B show the structure of the memory cell to which the present invention is applied. FIG. 3A shows a case where the memory cells are formed on a P-type substrate P-sub, and FIG. 3B shows a case where the memory cells are formed on an N-type substrate N-sub. In any case, terminal Tb is connected to voltage supply circuit 14-3, terminal Ts is connected to second current path 14-2, terminal Tg is connected to negative voltage supply circuit 15 and terminal Td is connected to first current path 14-1.

FIG. 4 is a circuit diagram showing cell voltage control circuit 14. In FIG. 4, the memory array comprising memory cells MC00 to MCmn is represented by one memory cell, and the column selection transistors are also represented by one column selection transistor.

The cell voltage control circuit 14 includes first current path 14-1 connected to common drain line CBL and containing first switching element M1 which performs an on/off operation on the basis of source/drain discharge control signal CSBLDIS of the erasing control signals and a high-resistant element or a constant current element, a second current path 14-2 connected to common source line CSL and having a second switching element M2 which performs an on/off operation on the basis of source/drain discharge control signal CSBLDIS and a high-resistant element or a constant current element, and positive voltage supply circuit 14-3 which is connected to common substrate line CWL and applies a positive potential Vcc to the substrate portion of each memory cell in accordance with substrate discharge control signal CWLCHR of the erasing control signals.

In this embodiment, cell voltage control circuit 14 includes fifth switching element M5 which switches on/off on the basis of drain discharge control signal CBLDIS of the erasing control signals, and sixth switching element M6 which switches on/off on the basis of source discharge control signal CSLDIS of the erasing control signals.

Figure 5:
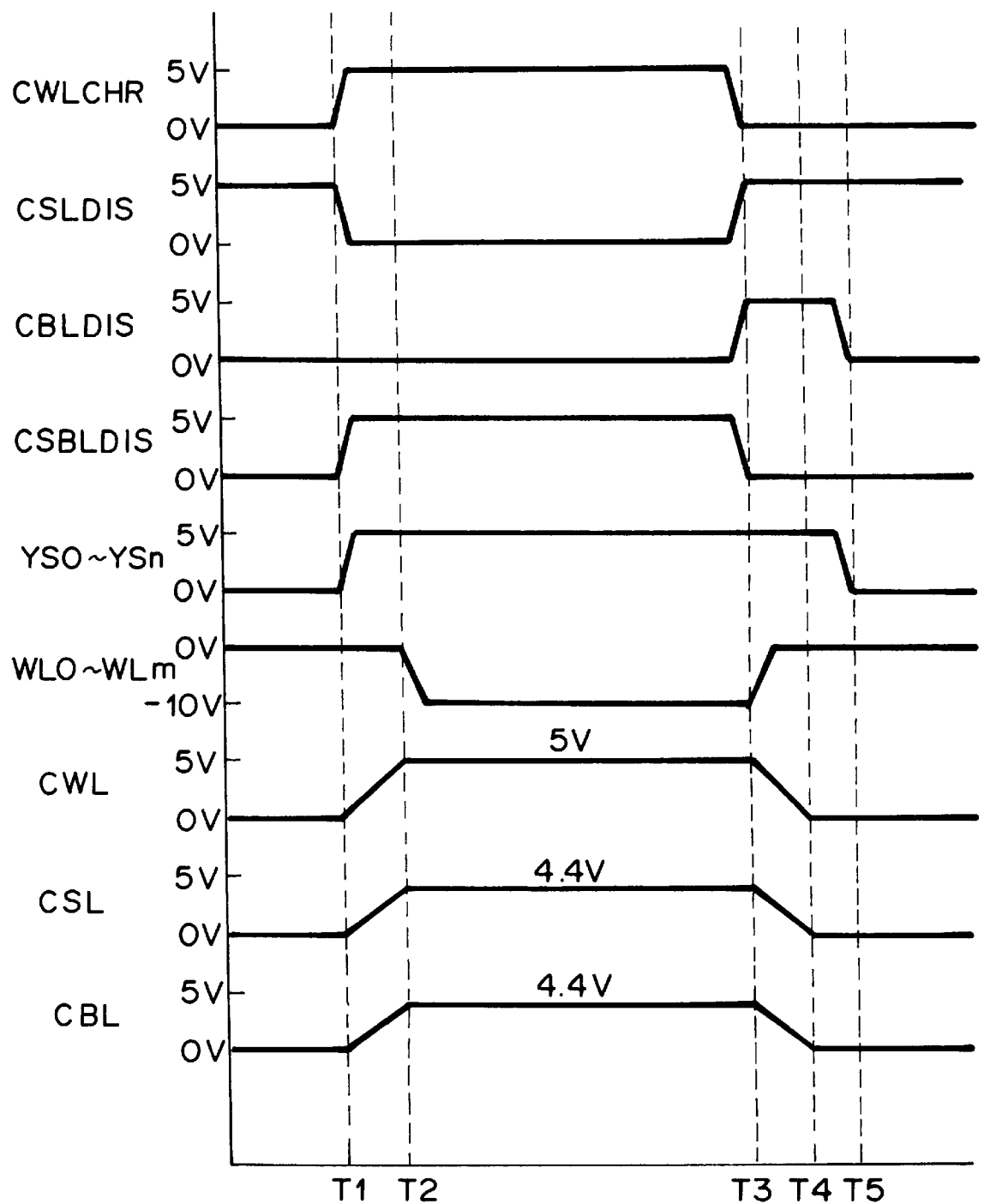
FIG. 5 is a diagram showing the signal waveform of each part of FIG. 4.

Next, the erasing operation will be explained with further reference to FIG. 5. When the erasing operation starts at time T1, column selection transistors TS0 to TSn are switched on, substrate charge control signal CWLCHR is supplied to positive voltage supply circuit 14-3 and the charge-up to the substrate portion of each memory cell through common substrate line CWL starts. At the same time, first and second current paths 14-1 and 14-2 are formed on the basis of the source/drain discharge control signal CSBLDIS, and the source and drain are connected to the ground potential. On the other hand, source discharge control signal CSLDIS is switched off, and drain discharge control signal CBLDIS remains switched off. As a result, the potential of the source and drain of each memory cell is increased through common source line CSL and common drain line CBL, respectively and through the diffusion layer which is forwardly biased. In this case, the breakdown voltage in the forward direction of each memory cell is set to 0.6 (V).

At time T2, the charge-up to the substrate portion of each memory cell through common substrate line CWL is completed, and at this time the supply of the negative voltage (−10V) from negative voltage supply circuit 15 through row decoder 11 and row lines WL0 to WLm to the gate of each memory cell starts, and the actual erasing operation starts.

The supply of the negative voltage to the gate of each memory cell may be started at time T1. However, in this case, because the voltage of each row line shifts to the positive voltage in the progress of rising up the P-well potential of each memory cell by the capacitance between the channel portion and the gate of each memory cell, it is necessary to discharge this charges and further supply a negative potential. Therefore, the substantial erasing time is shortened. In consideration of this disadvantage, it is effective that the current path between each row line and the ground potential is established and the charge corresponding to the increment of the potential of each row line due to the increase of the p-well potential is discharged to the ground side in the progress of rising up the P-well potential of each memory cell.

At the end time when the erasing operation completes, substrate charge control signal CWLCHR and source/drain discharge control signal CSBLDIS are turned off, source discharge control signal CSLDIS and drain discharge control signal CBLDIS are turned on. At the time T3, the supply of the negative voltage to the gate of each memory cell is stopped to finish the erasing operation so as to shift the potential of row lines WL0 to WLm to the ground potential. Common source line CSL and common drain line CBL are shifted to the ground potential by fifth and sixth switching elements M5 and M6 for discharging which are turned on, and common substrate line CWL is shifted to the ground potential. As a result, row lines WL0 to WLm are set to the ground potential, and at time T4, common substrate line CWL, common source line CSL and common drain line CBL are set to the ground potential, and the erasing operation substantially finishes. Subsequently, drain discharge control signal CBLDIS is turned off and column selection transistors YS0 to YSn are turned off. At time T5, all control signals complete the erasing operation state, and the erasing operation mode completes.

Figure 6A:
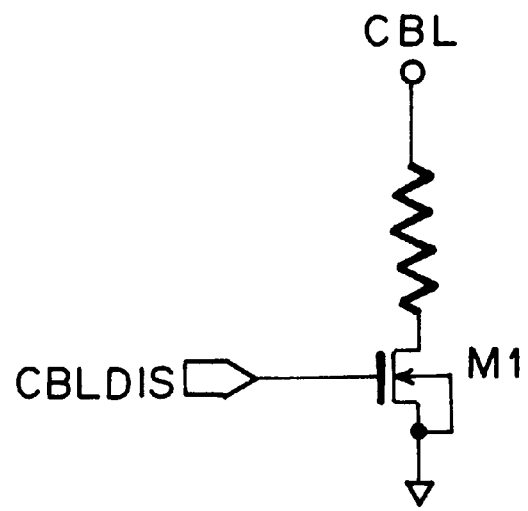
FIG. 6A is a diagram showing the construction of a current path in the case of a high-resistant element shown in FIG. 2.
Figure 6B:
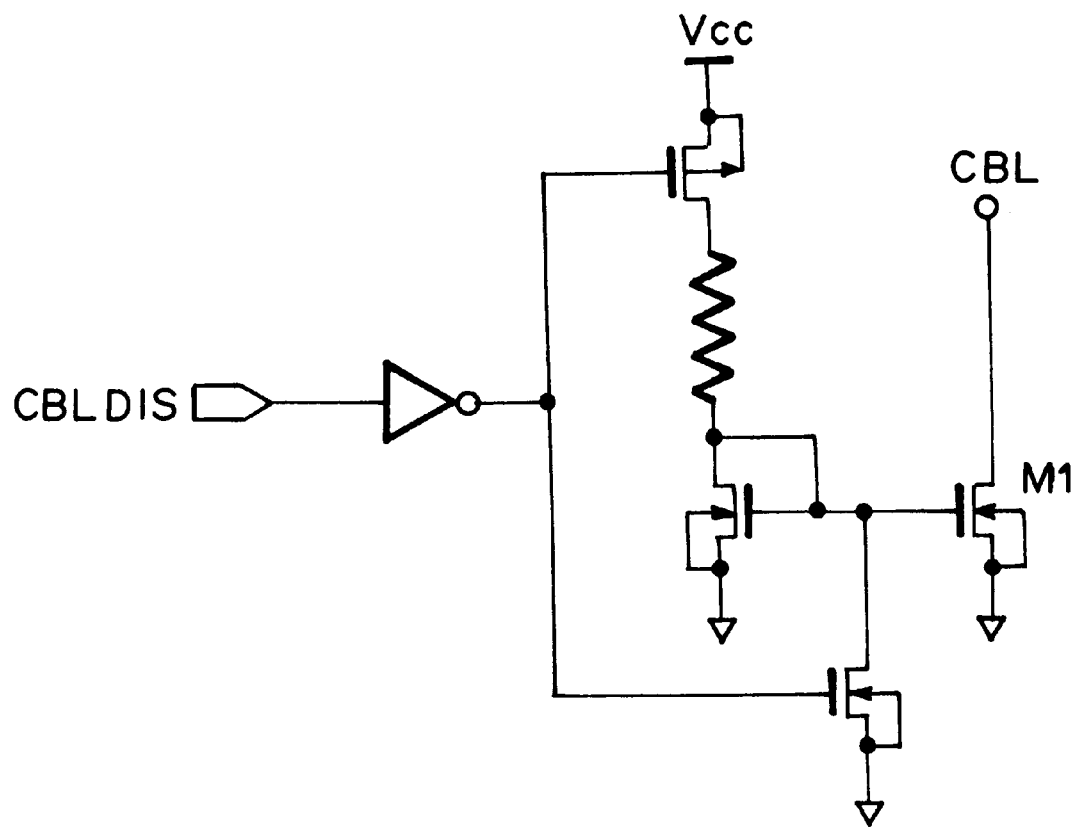
FIG. 6B is a diagram showing the construction of a current path in the case of a constant current element shown in FIG. 2.

FIGS. 6A and 6B show the construction of first and second current paths 14-1 and 14-2. FIG. 6A shows a case where the high-resistant element is implemented by the resistant element (the diffusion layer resistance, the polysilicon resistance, etc.) in the first switching element M1, and FIG. 6B shows a case where an inverter element is used, constant current is generated by a resistant element (diffusion layer resistance, polysilicon resistance, etc.) and a constant current element is implemented by a current mirror circuit comprising N-type transistors. This is applied to second switching element M2.

In any case, the current value of each current path is determined by adjusting the gate length and the gate width of first and second switching elements M1, M2.

Figure 7:
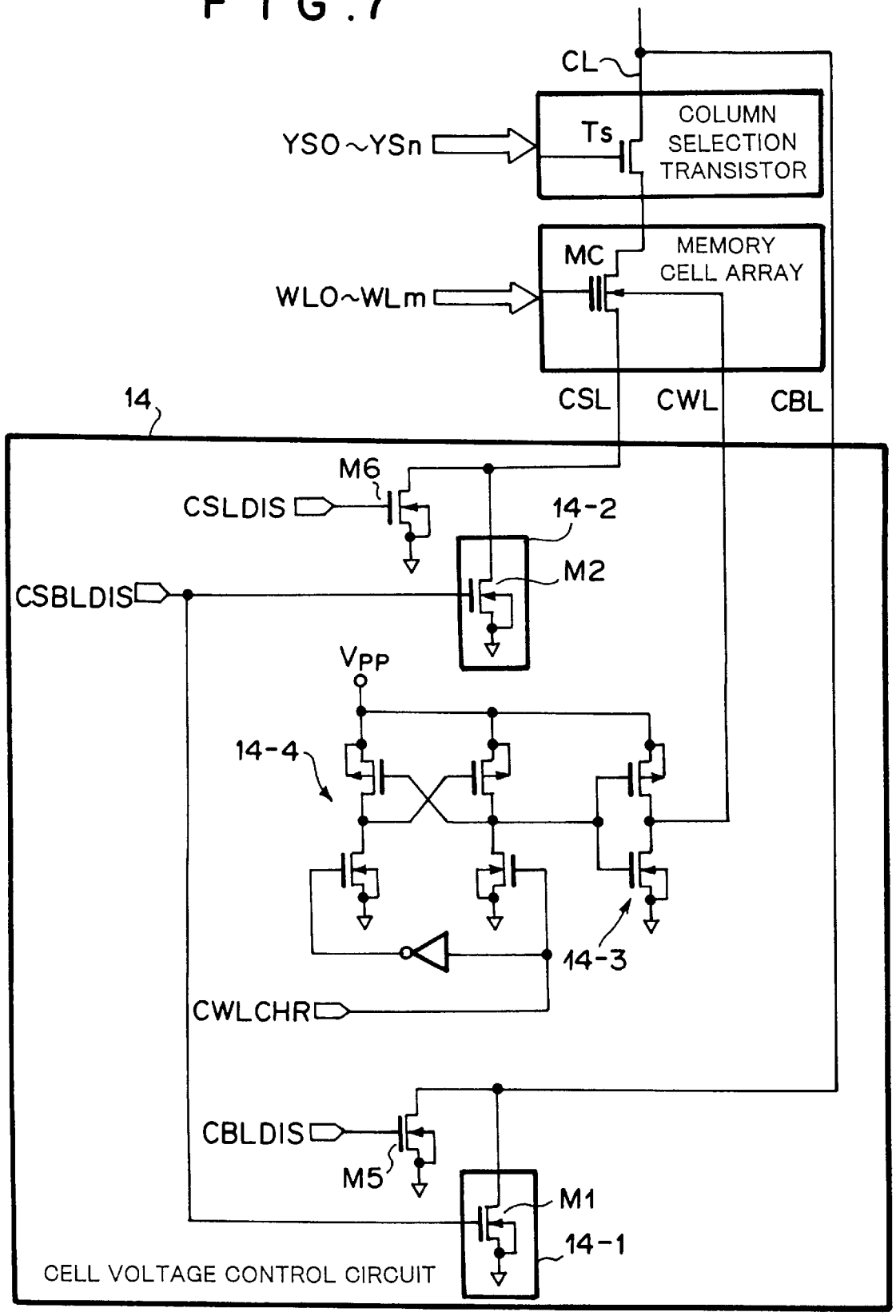
FIG. 7 is a diagram showing the construction of a modification of the cell voltage control circuit shown in FIG. 4.

FIG. 7 shows another example of cell voltage control circuit which is a modification of cell voltage control circuit 14 of FIG. 4. In the circuit of FIG. 4, the external supply voltage Vcc is supplied to the substrate portion of each memory cell through common substrate line CWL. However, in this example, the voltage Vpp, which is higher than the voltage Vcc and generated outside or inside the device using level shift circuit 14-4, is supplied to the substrate portion of each memory cell. That is, since the voltage Vpp is higher than the voltage Vcc, level shift circuit 14-4 is connected to the input side of positive voltage supply circuit 14-3. Cell voltage control circuit 14 has the same erasing operation as the circuit shown in FIG. 4 except that the substrate portions of the respective memory cells are supplied with different voltages.

Figure 8:
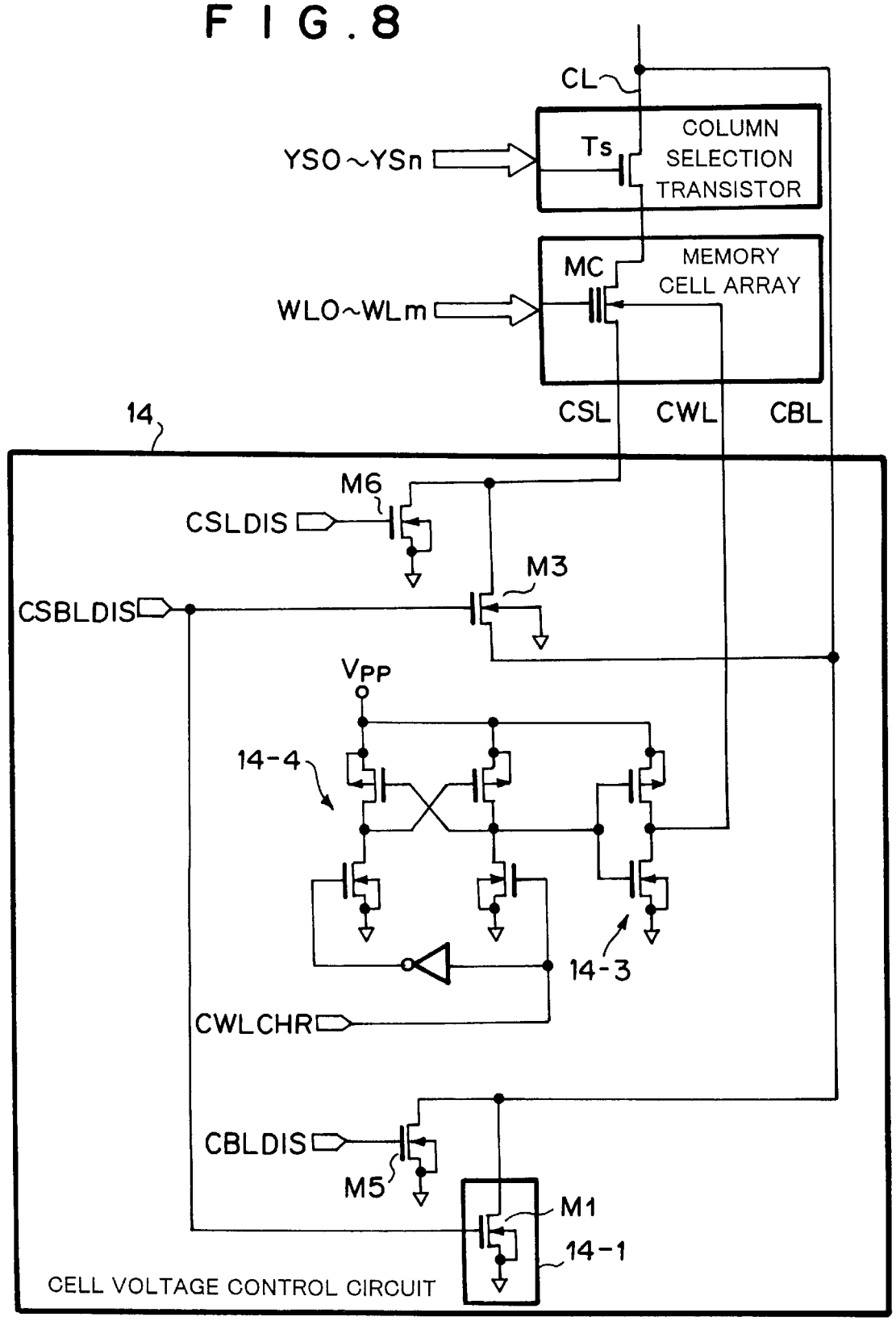
FIG. 8 is a diagram showing a second embodiment of the cell voltage control circuit shown in FIG. 1.

FIG. 8 shows a second embodiment of cell voltage control circuit 14 according to the present invention.

In this embodiment, third switching element (transistor) M3 is provided in the place of second current path 14-2 of FIG. 4, and third switching element M3 is switched on on the basis of source/drain discharge control signal CSBLDIS so as to conduct the common source line CSL and the common drain line CBL to each other. As a result, the source of each memory cell is connected to the ground potential through first current path 14-1 together with the drain of each memory cell. The erasing operation of this embodiment is basically identical to that of FIG. 4, however, only one high-resistant element or constant current element is required. Therefore, this embodiment is effective to reduce the area of the circuit in the case that the size of the high-resistant element or constant current element is large.

Figure 9:
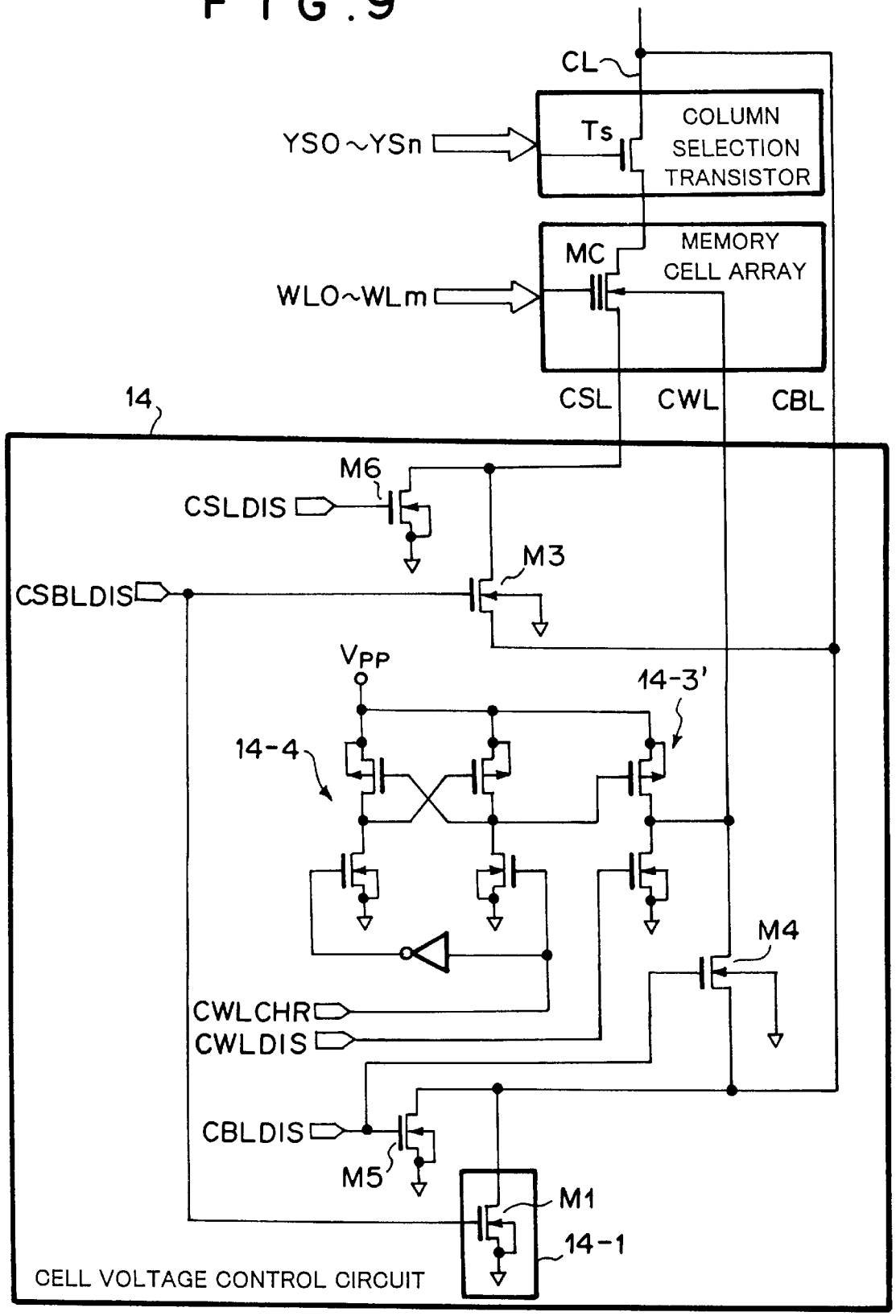
FIG. 9 is a diagram showing a third embodiment of the cell voltage control circuit shown in FIG. 1.

FIG. 9 shows a third embodiment of cell voltage control circuit 14 according to the present invention.

In this embodiment, the discharge operation of common substrate line CWL, common source line CSL and common drain line CBL at the end time of the erasing operation is improved. This is implemented by adding the circuit of FIG. 8 with the following construction. That is, fourth switching element (transistor) M4 is connected across common substrate line CWL and first current path 14-1 to conduct common substrate line CWL and first current path 14-1 at the end time of the erasing operation, whereby the potential of the substrate portion of each memory cell and the potential of the source and drain of each memory cell are simultaneously discharged through fifth switching element M5. Therefore, the gate of one transistor of positive voltage supply circuit 14-3' is separated from the gate of the other transistor, substrate discharge control signal CWLDIS of the erasing control signals is newly supplied, and drain discharge control signal CBLDIS is supplied to the gate of fourth switching element M4.

Figure 10:
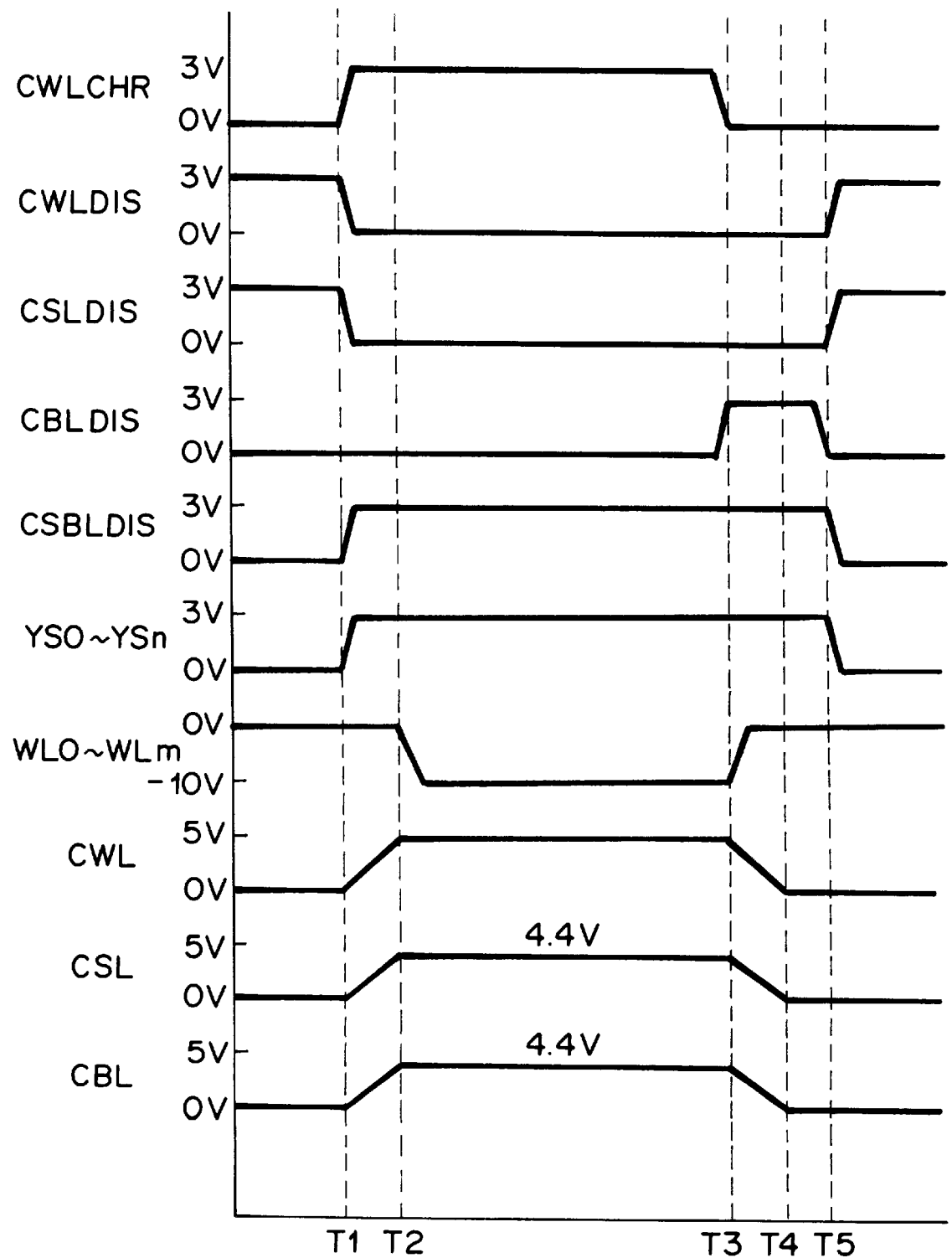
FIG. 10 is a diagram showing the signal waveform of each part of FIG. 9.

Next, the erasing operation of the third embodiment will be explained with further reference to FIG. 10. The erasing operation is identical to that of FIG. 5 at the start time of the erasing operation. When the erasing operation starts at time T1, the column selection transistors TS0 to TSn are switched on, and the substrate charge control signal CWLCHR is supplied to level shift circuit 14-4 so as to start the charge-up to the substrate portion of each memory cell through the common substrate line CWL. At the same time, third switching element M3 is conducted on the basis of source/drain discharge control signal CSBLDIS, and further first current path 14-1 is formed so as to connect the source and drain to the ground potential. On the other hand, the substrate discharge control signal CWLDIS and the source discharge control signal CSLDIS are turned off, and the drain discharge control signal CBLDIS remains turned off. As a result, the potential of the source and drain of each memory cell is increased through the common source line CSL and the common drain line CBL, respectively and through the diffusion layer which is forwardly biased. In this case, the forward breakdown voltage of each memory cell is set to 0.6 (V).

At time T2, the charge-up to the substrate portion of each memory cell through the common substrate line CWL is completed, and at this time, the supply of the negative voltage (−10V) from negative voltage supply circuit 15 through row decoder 11 and row lines wL0 to WLm to the gate of each memory cell starts, whereby the actual erasing operation starts.

At the time when the erasing operation finishes, substrate charge control signal CWLCHR is turned off and drain discharge control signal CBLDIS is turned on, and at the time T3, in order to stop the erasing operation, the supply of the negative voltage to the gate of each memory cell is stopped to shift the potential of row lines WL0 to WLm to the ground potential and also shift the potential of common source line CSL, common substrate line CWL and common drain line CBL to the ground potential by third to fifth switching elements M3 to M5 which are switched on. As a result, row lines WL0 to WLm are set to the ground potential, and at time T4, the potential of common substrate line CWL, common source line CSL and common drain line CBL are set to the ground potential. Subsequently, drain discharge control signal CBLDIS is turned off so as to switch fourth and fifth switching elements M4 and M5 off, whereby the substantial erasing operation finishes. Further, at the time T5, substrate discharge control signal CWLDIS and source discharge control signal CSLDIS are turned on, source/drain discharge control signal CSBLDIS is turned off, and column selection transistors YS0 to Ysn are turned off, whereby all control signals complete the erasing operation state and the erasing operation mode completes.

As explained above, at the end time of the erasing operation, the potential of the substrate portion of each memory cell and the potential of the source and drain of each memory cell are simultaneously decreased by discharging through fifth switching element M5, whereby the potential of the channel portion of each memory cell and the potential of the source and drain of each memory cell are simultaneously shifted, hence no abnormal operation occurs.

Figure 11A:
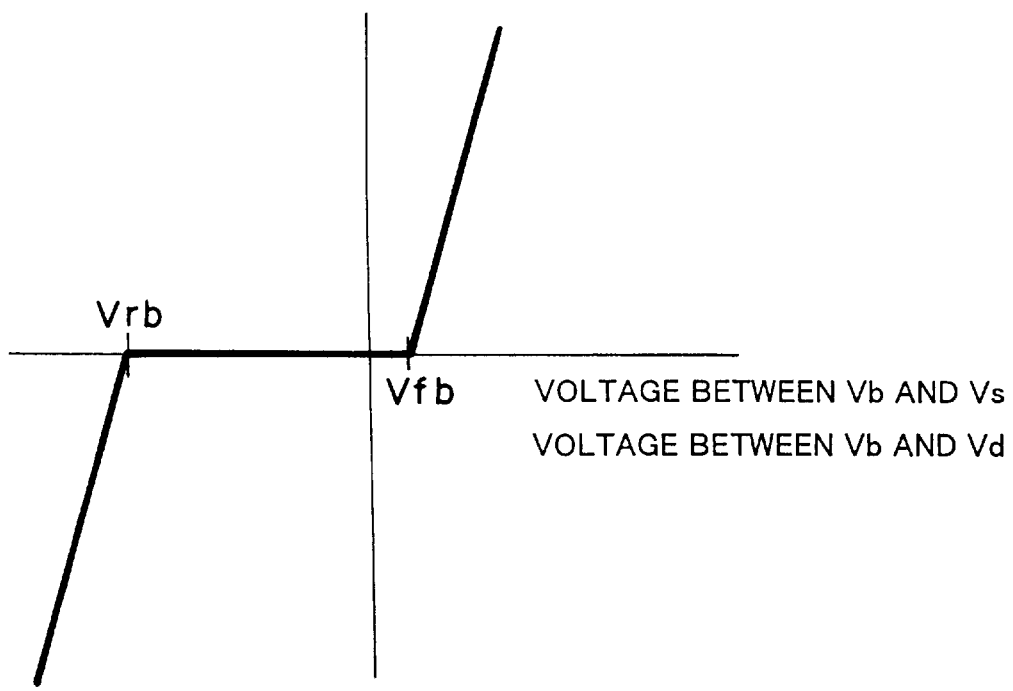
FIG. 11A is a diagram showing the characteristic of a PN diode between the source and drain of a P-well of the memory cell shown in FIG. 3A.
Figure 11B:
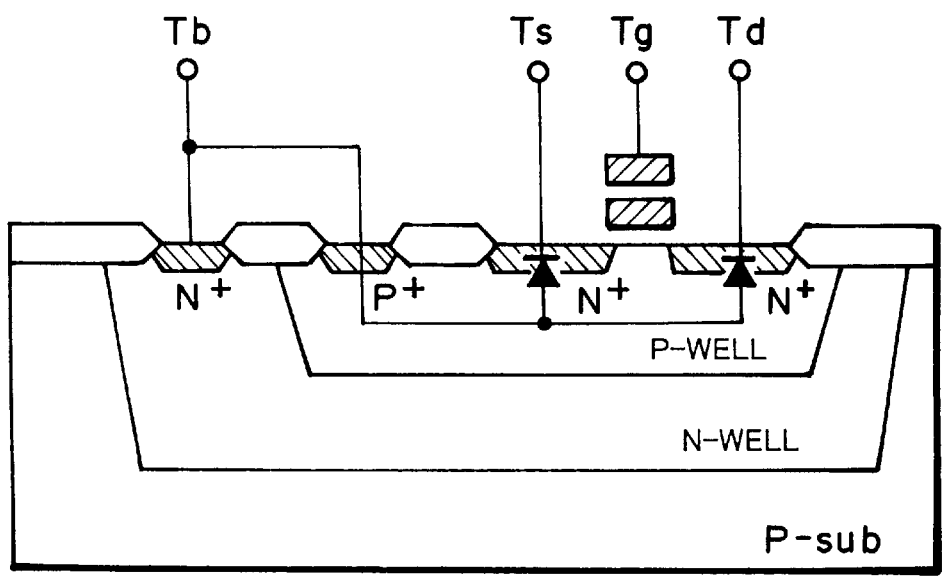
FIG. 11B is a diagram showing where PN diode exist in a memory cell on a P-type substrate shown in FIG. 3A.

FIG. 11 is a diagram showing the characteristics of PN diodes between the source and drain in the P-well of each memory cell shown in FIG. 3A for reference purposes. The forward breakdown voltage Vfb is generally equal to about 0.6 to 0.8 (V), and the reverse breakdown voltage Vrb is generally equal to 10(V) or thereabout although it is greatly varied in accordance with the concentration of the impurities of the P-well and the diffusion layer.

Figure 12A:
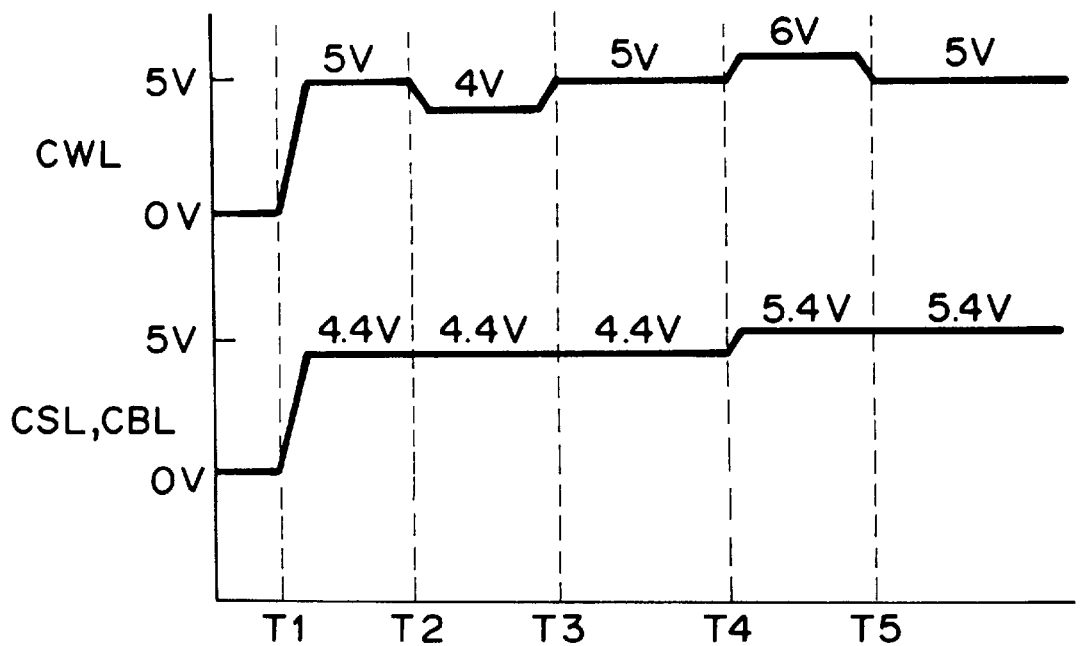
FIG. 12A is a diagram showing the variation of the source/drain potential during an erasing operation in the prior art.
Figure 15:
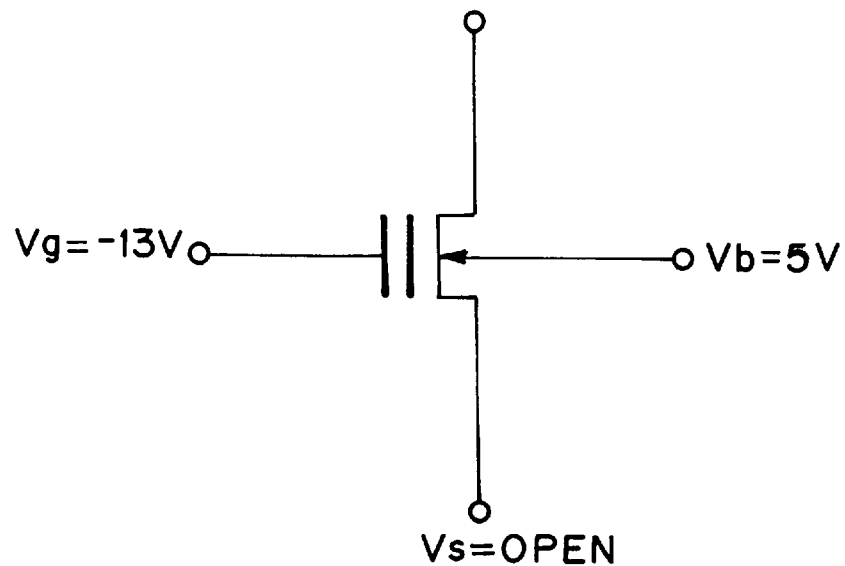
FIG. 15 is a diagram showing the conventional channel erasing system when the drain, source are opened.
Figure 16:
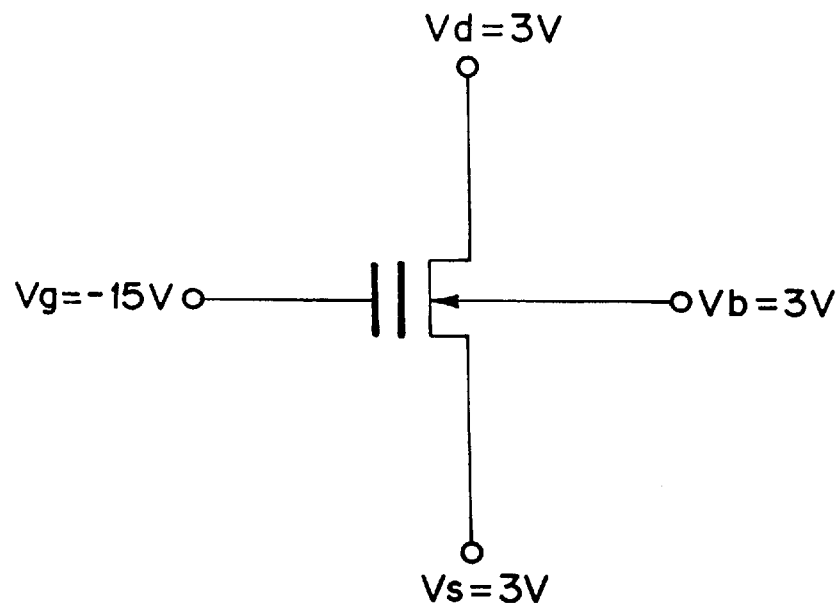
FIG. 16 is a diagram showing the conventional channel erasing system for applying a positive voltage to the drain, source.

FIG. 12 is a diagram showing the comparison result between the variation of the source/drain potential during the erasing operation in the prior art of FIG. 15 and the variation of the source/drain potential during the erasing operation in the present invention. In the case of the prior art, as shown in FIG. 12A, on the condition that a noise is input to common substrate line CWL, when the potential of common substrate line CWL rises to a higher voltage (the time T4 to T5), the potential of common source line CSL and common drain line CBL follows this variation. However, when the potential of the common substrate line CWL falls to a lower voltage (the time T2 to T3), the potential of the common source line CSL and the common drain line CBL does not follow this variation. Further, even when the potential rises to a high voltage, if the column selection transistor is non-conductive, the respective column lines are separated, and thus the transfer of the noise is varied in accordance with the position in the memory cell array due to the resistance and the parasitic capacitance of the P-well, hence the potential of each column line varies and thus the erasing speed also varies.

Figure 12B:
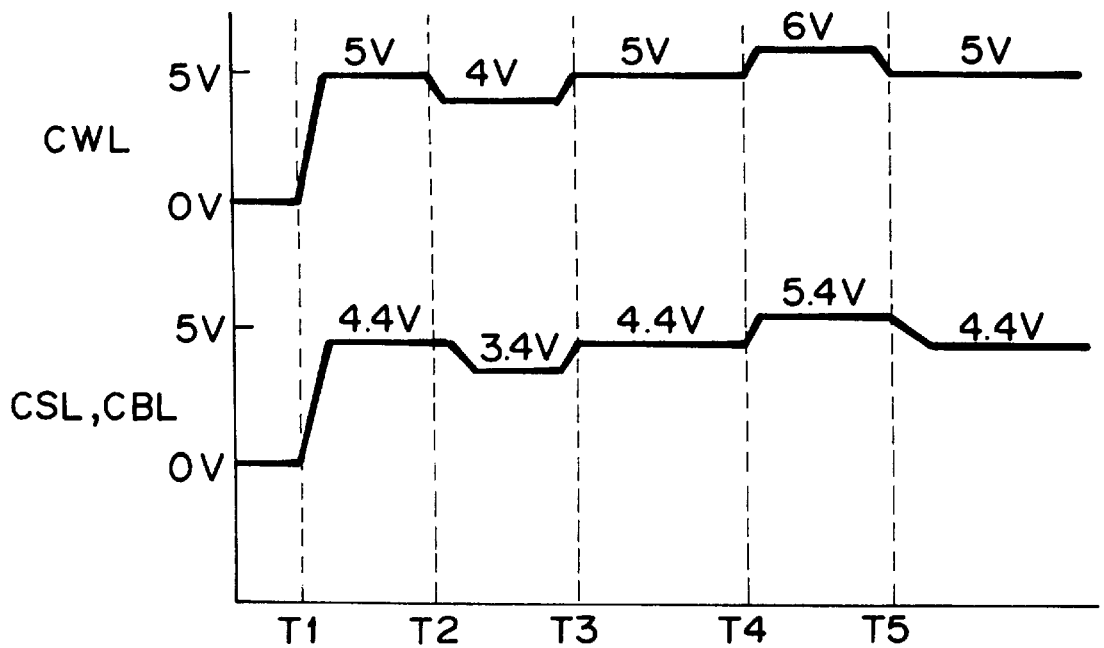
FIG. 12B is a diagram showing the variation of the source/drain potential during an erasing operation according to the present invention.
Figure 13:
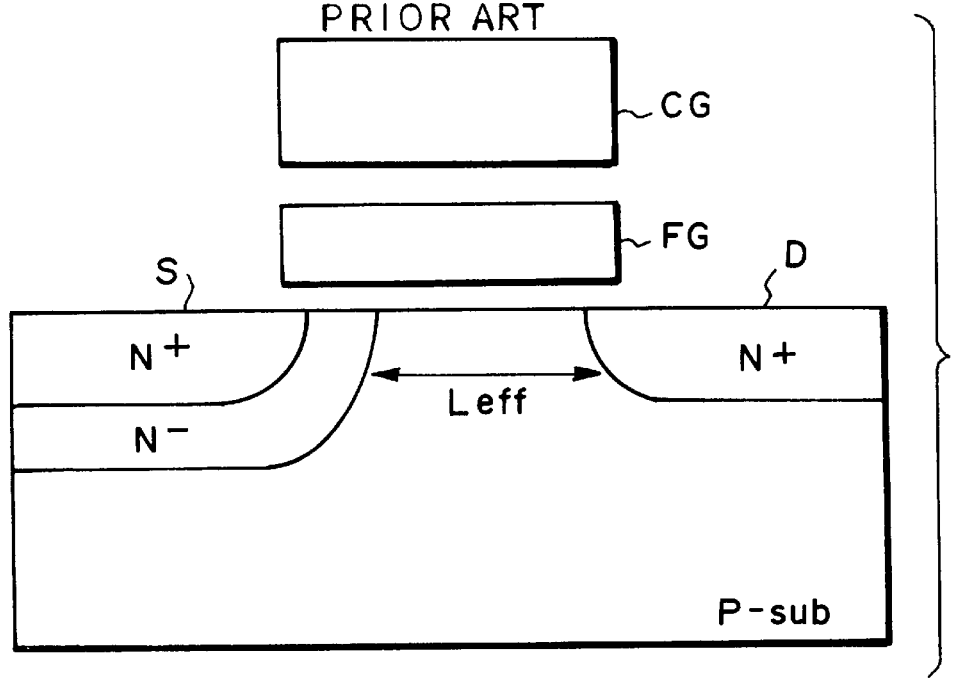
FIG. 13 is a cross-sectional view showing the structure of a memory cell which is applied to the conventional gate/source erasing system.
Figure 14:
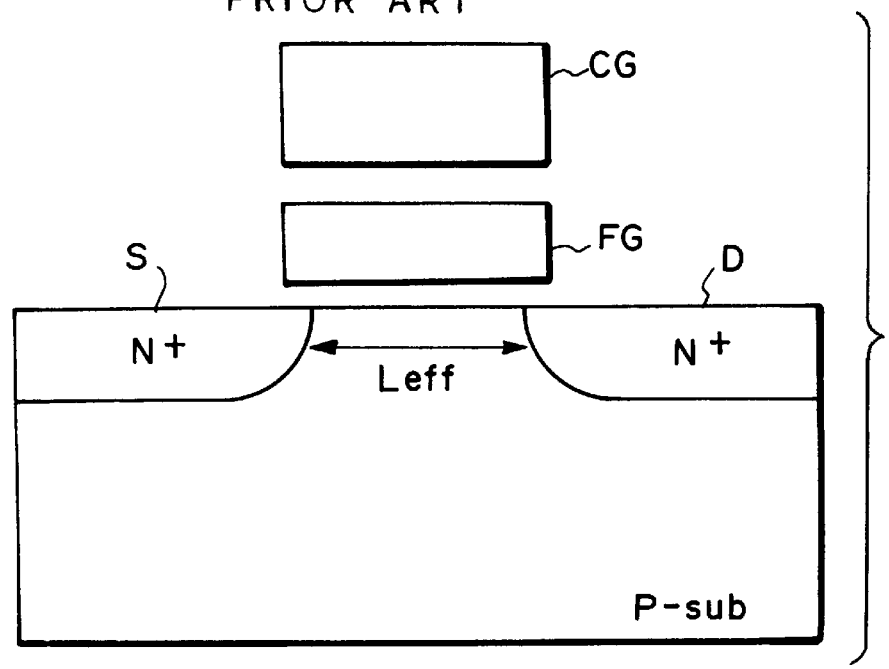
FIG. 14 is a cross-sectional view showing the structure of a memory cell which is applied to the conventional channel erasing system.

On the other hand, according to the present invention, because common source line CSL and common drain line CBL ensure the current path to the ground potential, they perfectly follow the potential of common substrate line CWL as shown in FIG. 12B, and thus the variation between the column lines can be suppressed.

Next, a second embodiment of the erasing method according to the present invention will be explained.

According to the second embodiment of the erasing method of the present invention, the first capacitance between floating gate FG and control gate CG of the memory cell in FIGS. 3A and 3B is set to be higher than the second capacitance between floating gate FG and the channel, and at the erasing time, a negative potential is applied to the gate of each memory cell, a positive potential based on the external supply voltage Vcc is applied to the channel of each memory cell, and further the source and drain of each memory cell are connected to the ground potential through the current path having high resistance.

A specific method of setting the first capacitance to be higher than the second capacitance can be implemented by reducing the thickness of the insulating film between floating gate FG and control gate CG and increasing the thickness of the insulating film between floating gate FG and the channel.

Another method of setting the first capacitance to be higher than the second capacitance may be implemented by forming the insulating film between the floating gate FG and the control gate CG of a nitride film or a multilayered film of an oxide film and a nitride film, or a high dielectric-constant film such as tantalum oxide or the like.

In any case, the erasing method of the second embodiment may be applied to control circuit 14 of FIG. 4 and the control circuit 14 of FIGS. 8 and 9 excluding level shift circuit 14-4. The operation is identical to that of the erasing method of the first embodiment.

The erasing method of the second embodiment may be implemented even if control circuit 14 consists of only positive voltage supply circuit 14-3. That is, it may be implemented by setting the first capacitance between floating gate FG and control gate CG of each memory cell to be higher than the second capacitance between floating gate FG and the channel and by applying a negative potential to the gate of each memory cell in the erasing operation while a positive potential based on the external supply voltage Vcc is applied to the channel of each memory cell. In this case, source/drain discharge control signal CSBLDIS, source discharge control signal CSLDIS and drain discharge control signal CBLDIS are not required as the erasing control signals.

As explained above, according to the method and device according to the first embodiment of the present invention in which the positive potential is applied to the well or substrate portion of each memory cell, the negative potential is applied to the gate of each memory cell, and the source and drain are connected to the ground potential through the high-resistant current path in the erasing operation, and according to the method and device according to the second embodiment of the present invention in which the first capacitance between the floating gate and the control gate of each memory cell is set to be higher than the second capacitance between the floating gate and the channel, and in the erasing operation the negative potential is applied to the gate of each memory and the positive potential based on the external supply voltage is applied to the channel of each memory cell, the potential of the source and drain in the erasing operation can be stabilized and the stable erasing characteristic can be obtained. Further, the present invention can be more easily implemented as compared with the conventional system of applying a voltage to the source and drain.

What is claimed is:

1. An erasing method for a non-volatile semiconductor memory on the basis of a channel erasing system, which comprises the steps of applying a negative potential to the gate of a memory cell, applying a positive potential which is above a supply voltage Vcc from the external to the channel of said memory cell, and connecting the source and drain of said memory cell to the ground potential through a high-resistant current path, wherein all of said steps are executed in erasing operation.

2. The non-volatile semiconductor memory erasing method as claimed in claim 1, which further comprises a step of simultaneously discharging the charge causing the potential of the substrate portion of said memory cell and the potential of the source and drain of said memory cell when said erasing operation is finished.

3. The non-volatile semiconductor memory erasing method as claimed in claim 1, wherein said current path comprises a circuit which contains a switching element and a high-resistant element or a constant current element.

4. The non-volatile semiconductor memory erasing method as claimed in claim 1, wherein said step of applying the positive potential to said channel is performed by applying a positive potential to the well or substrate portion of said memory cell.

5. The non-volatile semiconductor memory erasing method as claimed in claim 1, wherein the ground potential is supplied from the external.

6. The non-volatile semiconductor memory erasing method as claimed in claim 1, wherein said step of applying the negative potential to said gate is performed after said step of applying the positive potential to said channel.

7. A non-volatile semiconductor memory erasing method for erasing a memory cell containing a floating gate and a control gate on the basis of a channel erasing system, which comprises the steps of setting a first capacitance between said floating gate and said control gate higher than a second capacitance between said floating gate and a channel of said memory cell, and in an erasing operation, connecting a source and a drain of said memory cell to ground potential through a highly resistant current path and applying a negative potential to said gates of said memory cell and a positive potential of a supply voltage Vcc from the external to the channel of said memory cell.

8. The erasing method as claimed in claim 7, wherein the film thickness between said floating gate and said control gate is reduced and the film thickness between said floating gate and said channel is increased, whereby said first capacitance is higher than said second capacitance.

9. The erasing method as claimed in claim 7, wherein an insulating film between said floating gate and said control gate is selected from the group consisting of a nitride film, a multilayered film composed of an oxide film and a nitride film and a high dielectric constant film, whereby said first capacitance is higher than said second capacitance.

10. The erasing method as claimed in claim 7, wherein said ground potential is supplied from the external.

11. The erasing method as claimed in claim 7, wherein said current path is a circuit comprising a switching element and a high resistant element or a constant current element.

12. The erasing method as claimed in claim 7, wherein said step of applying the positive potential to said channel is performed by applying the positive potential to the well or substrate portion of said memory cell.

13. The erasing method as claimed in claim 7, which further comprises a step of simultaneously discharging the charge causing the potential of the substrate portion of said memory cell and the charge causing the potential of the source and drain of said memory cell when said erasing operation is finished.

14. The erasing method as claimed in claim 7, wherein the application of the negative potential to said gate is performed after the application of the positive potential to said channel.

15. A non-volatile semiconductor memory erasing device based on a channel erasing system, which comprises:
   a voltage supply circuit for applying a negative potential to a gate of a memory cell; and
   a control circuit for applying to a channel of said memory cell a positive potential which is equal or above a supply voltage Vcc from the external and connecting the source and drain of said memory cell to ground potential through a high-resistant current path.

16. The erasing device as claimed in claim 15, wherein the drain of the memory cell is connected to a column selection transistor that is connected to a common drain line, and a well or substrate portion of said memory cell is connected to a common substrate line while the source of said memory cell is connected to a common source line, and wherein said control circuit comprises a first current path connected to said common drain line and including a first switching element which performs an on/off operation on the basis of an erasing control signal and a high-resistant element or a constant current element, a second current path connected to said common source line and including a second switching element which performs an on/off operation on the basis of an erasing control signal and a high-resistant element or a constant current element, and a circuit which is connected to said common substrate line and applies a positive potential to the well or substrate portion of said memory cell in accordance with the erasing control signal.

17. The erasing device as claimed in claim 15, wherein the drain of the memory cell is connected to a column selection transistor that is connected to a common drain line, and a well or substrate portion of said memory cell is connected to a common substrate line while the source of said memory cell is connected to a common source line, and wherein said control circuit comprises a first current path connected to said common drain line and including a first switching element which performs an on/off operation on the basis of an erasing control signal and a high-resistant element or a constant current element, a third switching element which is connected across said common source line and said common drain line to conduct said common source line and said common drain line in accordance with the erasing control signal, and a circuit which is connected to said common substrate line and applies a positive potential to the well or substrate portion of said memory cell in accordance with the erasing control signal.

18. The erasing device as claimed in claim 17, wherein said control circuit further comprises a fourth switching element which is connected across said common substrate line and said first current path to conduct said common substrate line and said first current path to each other when the erasing operation is finished, whereby the charge causing the potential of the substrate portion of said memory cell and the potential of the source and drain of said memory cell are simultaneously discharged when the erasing operation is finished.

19. The erasing device as claimed in claim 15, wherein said ground potential is supplied from the external.

20. The erasing device as claimed in claim 15, wherein the application of the negative potential to said gate is performed after the application of the positive potential to said channel.

21. A non-volatile semiconductor memory erasing device for erasing a memory cell containing a floating gate and a control gate on the basis of a channel erasing system, which comprises a voltage supply circuit for applying a negative potential to the gate of said memory cell in an erasing operation, and a control circuit for connecting a source and a drain of the memory cell to ground potential through a highly resistant current path and for applying a positive potential of a supply voltage Vcc from the external to the channel of said memory cell in an erasing operation, wherein a first capacitance between said floating gate and said control gate is higher than a second capacitance between said floating gate and the channel of said memory cell.

22. The non-volatile semiconductor memory erasing device as claimed in claim 21, wherein the film thickness between said floating gate and said control gate is reduced and the film thickness between said floating gate and said channel is increased to set said first capacitance to be higher than said second capacitance.

23. The non-volatile semiconductor memory erasing device as claimed in claim 21, wherein an insulating film between said floating gate and said control gate is selected from the group consisting of a nitride film, a multilayered film of an oxide film and a nitride film and a high dielectric-constant film of tantalum, whereby said first capacitance is set to be higher than said second capacitance.

24. The non-volatile semiconductor memory erasing device as claimed in claim 22, wherein said ground potential is supplied from the external.

25. The non-volatile semiconductor memory erasing device as claimed in claim 21, wherein the drain of the memory cell is connected to a column selection transistor that is connected to a common drain line, and a well or substrate portion of said memory cell is connected to a common substrate line while the source of said memory cell is connected to a common source line, and wherein said control circuit comprises a first current path connected to said common drain line and including a first switching element which performs an on/off operation on the basis of an erasing control signal and a high resistant element or a constant current element, a second current path connected to said common source line and including a second switching element which performs an on/off operation on the basis of the erasing control signal and a high resistant element or a constant current path, and a circuit which is connected to said common substrate line and applies a positive potential to the well or substrate portion of said memory cell in accordance with the erasing control signal.

26. The non-volatile semiconductor memory erasing device as claimed in claim 21, wherein the drain of the memory cell is connected to a column selection transistor that is connected to a common drain line, and a well or substrate portion of said memory cell is connected to a common substrate line while the source of said memory cell is connected to a common source line, and wherein said control circuit comprises a first current path connected to said common drain line and including a first switching element which performs an on/off operation on the basis of an erasing control signal and a high resistant element or a constant current element, a third switching element which is connected across said common source line and said common drain line to conduct said common source line and said common drain line to each other in accordance with said erasing control signal, and a circuit which is connected to said common substrate line and applies a positive potential to the well or substrate portion of said memory cell in accordance with said erasing control signal.

27. The non-volatile semiconductor memory erasing device as claimed in claim 26, wherein said control circuit further includes a fourth switching element which is connected across said common substrate line and said first current path to conduct said common substrate line and said first current path when said erasing operation is finished, thereby simultaneously discharging the charge causing the potential of the substrate portion of said memory cell and the potential of the source and drain of said memory cell when said erasing operation is finished.

28. The non-volatile semiconductor memory erasing device as claimed in claim 21, wherein said application of the negative potential to said gate is performed after said application of the positive potential to said channel.

\* \* \* \* \*